(12) United States Patent
Jiang (10) Patent No.: US 10,598,338 B1
(45) Date of Patent: Mar. 24, 2020

(54) VEHICLE HEADLIGHT AND METHOD OF MAKING THE SAME

(71) Applicant: Guangzhou Tai Da Electric Appliance Co., Ltd, Guangzhou, Guangdong (CN)

(72) Inventor: Qian Jiang, Guangdong (CN)

(73) Assignee: Guangzhou Tai Da Electric Appliance Co., Ltd, Guangzhou (CN)

( * ) Notice: Subject to any disclaimer, the term of this patent is extended or adjusted under 35 U.S.C. 154(b) by 0 days.

(21) Appl. No.: 16/207,194

(22) Filed: Dec. 3, 2018

(51) Int. Cl.
| | |
|---|---|
| *F21S 45/47* | (2018.01) |
| *H05K 7/20* | (2006.01) |
| *F21V 29/89* | (2015.01) |
| *F21S 41/19* | (2018.01) |
| *F21V 15/01* | (2006.01) |
| *F21S 45/43* | (2018.01) |
| *F21S 41/141* | (2018.01) |
| *F21V 19/02* | (2006.01) |

(52) U.S. Cl.
CPC ............ *F21S 45/47* (2018.01); *F21S 41/141* (2018.01); *F21S 41/192* (2018.01); *F21S 41/198* (2018.01); *F21S 45/43* (2018.01); *F21V 19/02* (2013.01); *F21V 29/89* (2015.01); *H05K 7/20172* (2013.01); *F21V 15/01* (2013.01); *H05K 7/20136* (2013.01); *H05K 7/20154* (2013.01)

(58) Field of Classification Search
CPC .. F21S 45/40–49; F21S 41/141; F21S 41/147; F21S 41/321; F21S 41/192; F21S 41/198; F21V 19/02; F21V 29/76; F21V 29/83; F21V 29/89; F21V 15/01; F21V 23/06; F21V 23/02; F21V 23/00; F21V 23/001; F21Y 2107/90; F21Y 2115/10
USPC ........................ 361/679.46–679.54, 688–723
See application file for complete search history.

(56) References Cited

U.S. PATENT DOCUMENTS

| | | | | |
|---|---|---|---|---|
| 7,738,235 | B2 * | 6/2010 | Gloisten | F21V 5/04 361/173 |
| 7,740,380 | B2 * | 6/2010 | Thrailkill | F21V 29/004 362/294 |
| 9,476,564 | B2 * | 10/2016 | Lai | F21V 29/51 |
| 9,933,125 | B2 * | 4/2018 | Kuo | F21S 41/192 |
| 2016/0201870 | A1 * | 7/2016 | Ruckebusch | F21V 17/16 362/547 |
| 2017/0370552 | A1 * | 12/2017 | Bizzotto | F21V 29/74 |
| 2018/0159008 | A1 * | 6/2018 | Fan | F21V 29/87 |
| 2018/0299093 | A1 * | 10/2018 | Lai | F21S 41/155 |
| 2018/0363874 | A1 * | 12/2018 | Kawai | F21S 41/275 |

* cited by examiner

*Primary Examiner* — Zachary Pape
(74) *Attorney, Agent, or Firm* — Patent Masters LLC; Rui Wu (57) ABSTRACT

A method of manufacturing a vehicle headlight is provided. The method comprises: providing, between two housing parts of the vehicle headlight, a heat conducting member and one or more circuit boards, wherein one or more radiation generators are attached in or on the one or more circuit boards; forming a housing of the vehicle headlight by snapping the two housing parts together, wherein the heating conducting member and the one or more circuit boards are attached and fastened inside the housing, wherein the housing comprises an recess on a side surface of the housing, and wherein a fan is in the recess on the side surface of the housing.

16 Claims, 6 Drawing Sheets

VEHICLE HEADLIGHT AND METHOD OF MAKING THE SAME

BACKGROUND

1. Technical Field

The present disclosure relates generally to vehicle headlights. More specifically, the present disclosure relates to a vehicle headlight including a Light-Emitting Diode (LED), a heat sink, and a fan.

2. Discussion of Technical Background

The use of LEDs in vehicle headlights has been increasingly popular due to the advantages of the LEDs over filament or gas bulbs. The advantages of the LEDs include, but may not be limited to, a small size, a high lighting efficiency, a long life span, a high light intensity, and a high light quality. However, the LEDs, when in use in vehicle headlights, may generate a considerable amount of heats, which may damage the LEDs themselves or their surrounding components. Therefore, there is a need to address the heat problems of LEDs when used in vehicle headlights.

SUMMARY

In an example embodiment, there is provided a method of manufacturing a vehicle headlight, the method comprising: providing, between two housing parts of the vehicle headlight, a heat conducting member and one or more circuit boards, wherein one or more radiation generators are attached in or on the one or more circuit boards; forming a housing of the vehicle headlight by snapping the two housing parts together, wherein the heating conducting member and the one or more circuit boards are attached and fastened inside the housing, wherein the housing comprises an recess on a side surface of the housing, and wherein a fan is in the recess on the side surface of the housing.

In another example embodiment, there is provided a vehicle headlight comprising: one or more circuit boards, wherein one or more radiation generators are attached in or on the one or more circuit boards; a heat conducting member, wherein the one or more circuit boards are mounted to the heat conducting member; a heat sink thermally coupled to the heat conducting member, wherein the heat sink comprises an recess on a side surface of the heat sink; and a fan mounted in the recess on the side surface of the heat sink.

BRIEF DESCRIPTION OF THE DRAWINGS

The embodiments will be more readily understood in view of the following description when accompanied by the below figures and wherein like reference numerals represent like elements, wherein.

DETAILED DESCRIPTION

Reference will now be made in detail to the embodiments of the present disclosure, examples of which are illustrated in the accompanying drawings. While the present disclosure will be described in conjunction with the embodiments, it will be understood that they are not intended to limit the present disclosure to these embodiments. On the contrary, the present disclosure is intended to cover alternatives, modifications, and equivalents, which may be included within the spirit and scope of the present disclosure as defined by the appended claims.

In addition, in the following detailed description of embodiments of the present disclosure, numerous specific details are set forth in order to provide a thorough understanding of the present disclosure. However, it will be recognized by one of ordinary skill in the art that the present disclosure may be practiced without these specific details. In other instances, well-known methods, procedures, components, and circuits have not been described in detail as not to unnecessarily obscure aspects of the embodiments of the present disclosure.

Figure 1:
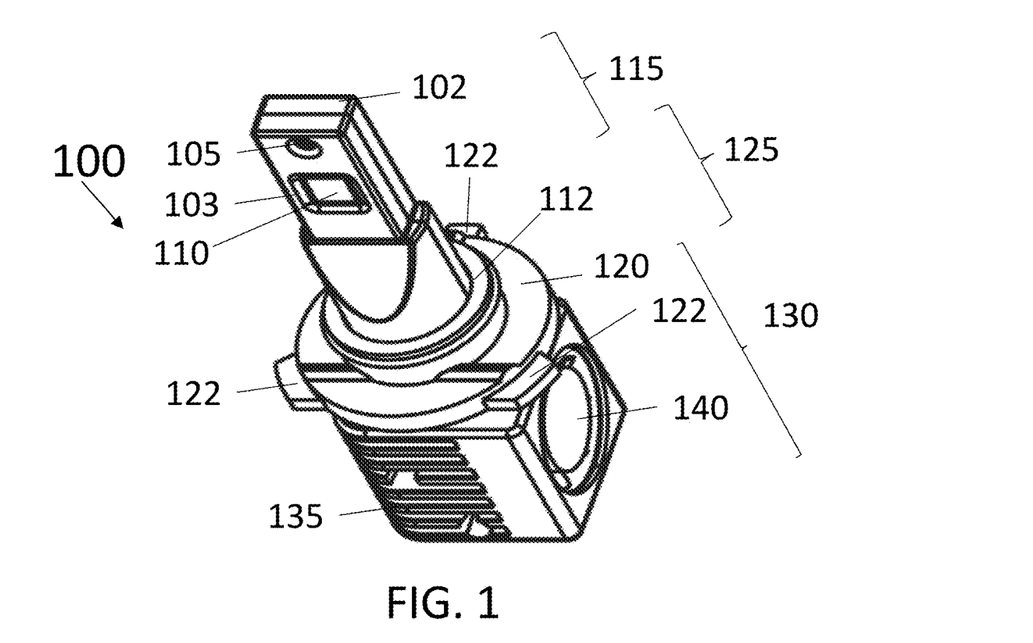
FIG. 1 is a perspective view of a vehicle headlight according to an embodiment of the disclosure.
Figure 2:
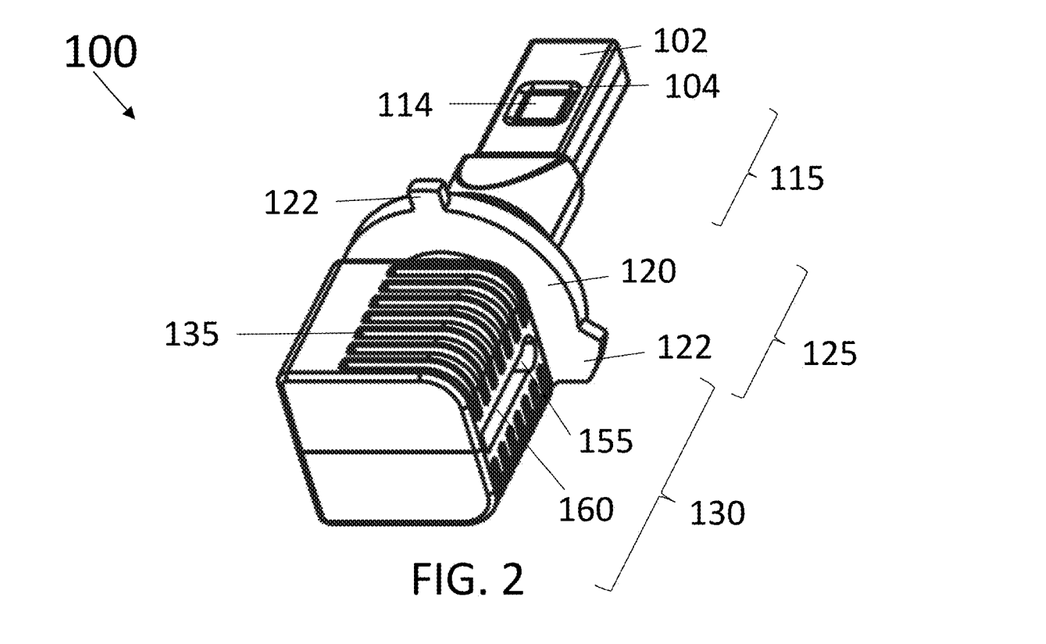
FIG. 2 is another perspective view of the vehicle headlight in FIG. 1 according to an embodiment of the disclosure.
Figure 3:
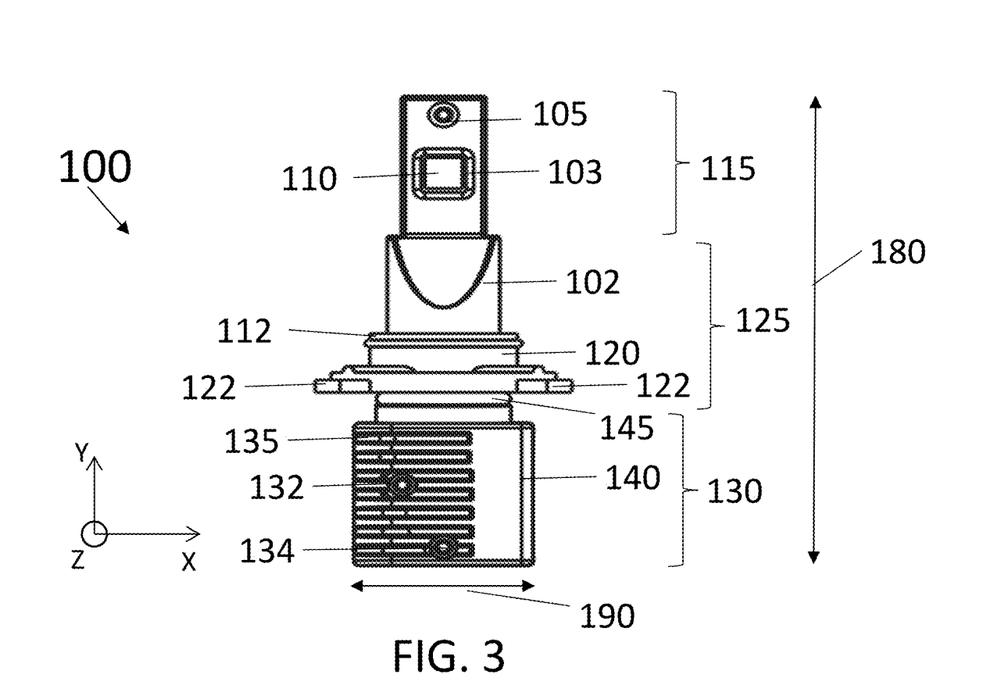
FIG. 3 is a front elevational view of the vehicle headlight shown in FIG. 1 in a X-Y plane according to an embodiment of the disclosure.
Figure 4:
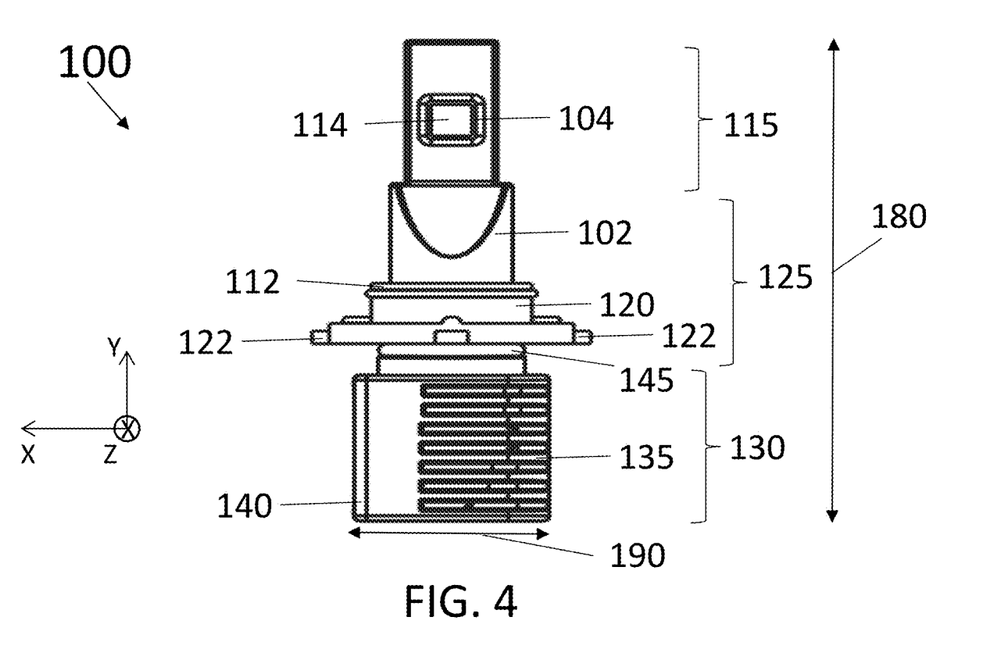
FIG. 4 is a back elevational view of the vehicle headlight shown in FIG. 3 in a X-Y plane according to an embodiment of the disclosure.
Figure 5:
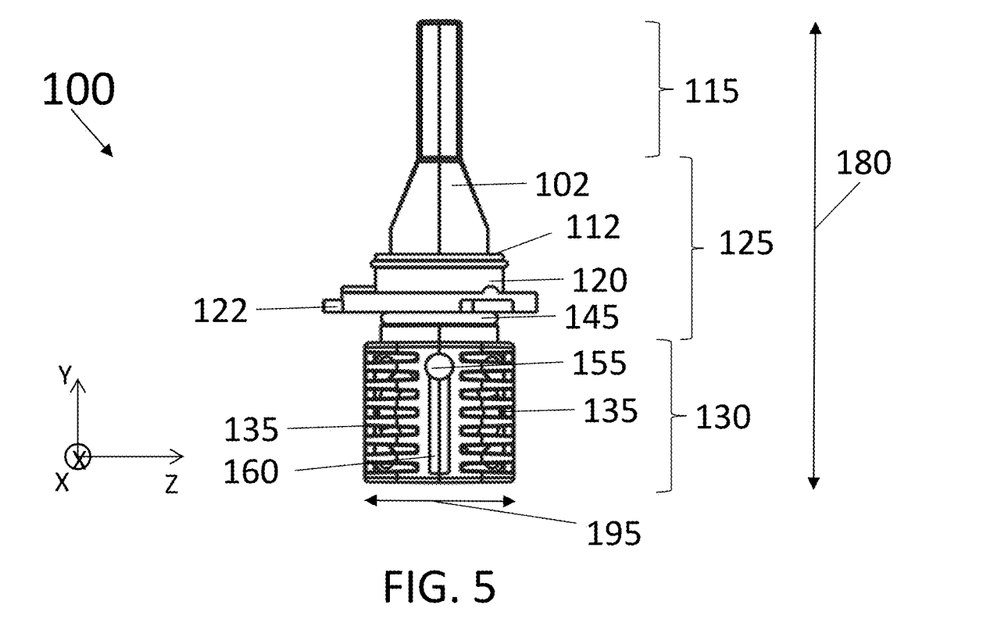
FIG. 5 is a left side view of the vehicle headlight shown in FIG. 3 in a Y-Z plane according to an embodiment of the disclosure.
Figure 6:
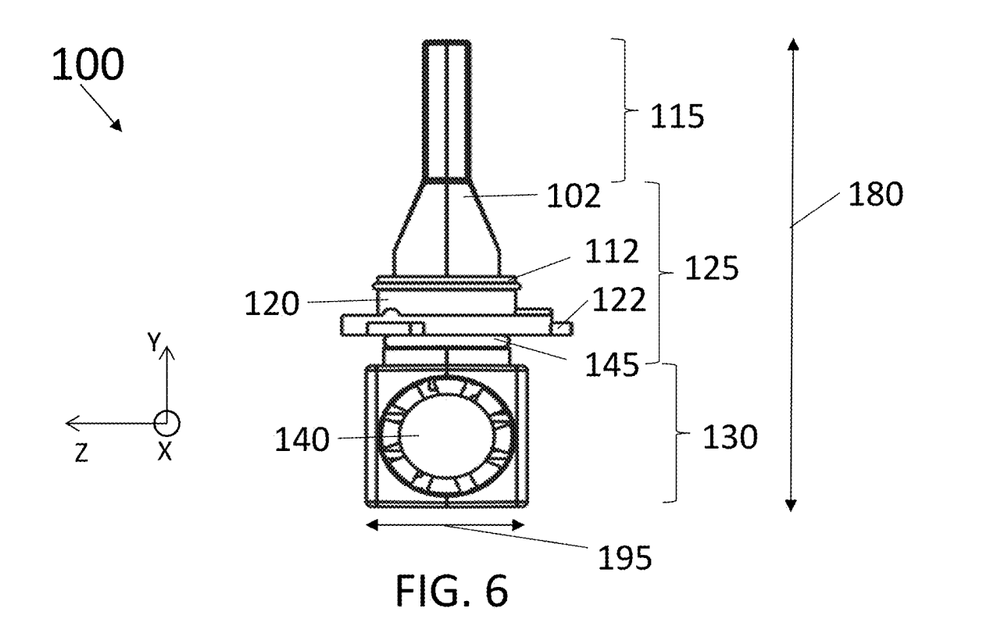
FIG. 6 is a right side view of the vehicle headlight shown in FIG. 3 in a Y-Z plane according to an embodiment of the disclosure.
Figure 7:
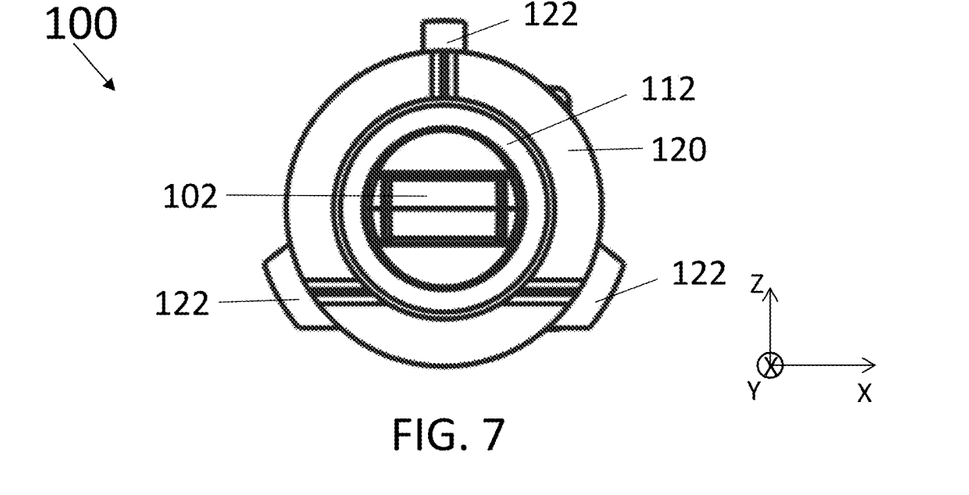
FIG. 7 is a top view of the vehicle headlight shown in FIG. 3 in a X-Z plane according to an embodiment of the disclosure.
Figure 8:
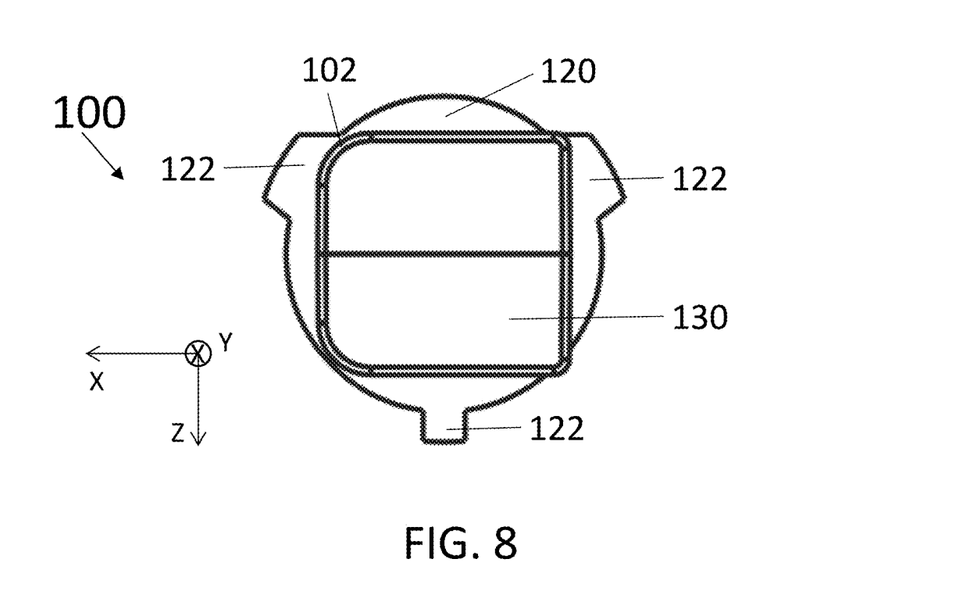
FIG. 8 is a bottom view of the vehicle headlight shown in FIG. 3 in a X-Z plane according to an embodiment of the disclosure.

FIG. 1 and FIG. 2 show different perspective views of a vehicle headlight 100 according to an embodiment of the disclosure. In addition, FIG. 3 and FIG. 4 show different elevation views of the vehicle headlight 100 according to an embodiment of the disclosure. Specifically, FIG. 3 is a front elevational view of the vehicle headlight 100 in a X-Y plane according to an embodiment of the disclosure. FIG. 4 is a back elevational view of the vehicle headlight 100 in a X-Y plane according to an embodiment of the disclosure. Moreover, FIG. 5 and FIG. 6 show different side views of the vehicle headlight 100 according to an embodiment of the disclosure. Specifically, FIG. 5 is a left side view of the vehicle headlight 100 in a Y-Z plane according to an embodiment of the disclosure. FIG. 6 is a right side view of the vehicle headlight 100 in a Y-Z plane according to an embodiment of the disclosure. Furthermore, FIG. 7 is a top view of the vehicle headlight 100 in a X-Z plane according to an embodiment of the disclosure. FIG. 8 is a bottom view of the vehicle headlight 100 in a X-Z plane according to an embodiment of the disclosure.

The vehicle headlight 100 may be mounted and used in a vehicle or an automobile. As used herein, the terms "automobile" and "vehicle" are used to refer to wheeled motor vehicles of all types. While the expected primary use of the disclosure is in over-the-road passenger vehicles such as cars, sport utility vehicles, and pick-ups, it is contemplated that the disclosure may be also used in other vehicles such as industrial vehicles, over-the-road semi-tractors, agricultural vehicles, and the like. It is also contemplated that the vehicle headlight as described herein may be useful in other applications such as boating, home, and industrial uses.

The vehicle headlight 100 includes a housing 102, a first ring 145, a second ring 112, a mounting structure 120, one or more radiation generators 110, 114, and a fan 140. Although not shown in FIGS. 1-8, the vehicle headlight 100 also includes a heat conducting member and one or more circuit boards. More details about the heat conducting member and the one or more circuit boards will be discussed in greater details below and in FIG. 9.

The housing 102 is configured to protect the various components in the housing 102 from fouling and stress. The housing 102 may be further configured to provide support for the mounting structure 120 that is used to attach the vehicle headlight 100 to a vehicle or an automobile, for example, in place in a light fixture of the vehicle or the automobile. In an embodiment, the housing 102 is made of one or more materials selecting from a group consisting of aluminum and zincum.

The housing 102 includes a tower body 115, a connecting body 125, and a heat sink 130. The tower body 115 may include one or more openings. For example, the tower body 115 includes a first opening 103 and a second opening 104 as shown in FIGS. 1-4. The one or more openings, for example, the first opening 103 and the second opening 104, may be configured to uncover the one or more radiation generators 110, 114 in the housing 102 so that the radiation beams emitted by the one or more radiation generators 110, 114 can be provided outside the housing 102. Each of the one or more radiation generators 110, 114 may include one or more radiation sources each of which is configured to emit a radiation beam. The one or more radiation sources may be laser diodes (LDs), light-emitting diodes (LEDs), vertical external cavity surface-emitting lasers (VECSELs), vertical cavity surface-emitting lasers (VCSELs), or any combination thereof. In an embodiment, the radiation sources included in the radiation generators 110,114 are all LEDs. In an embodiment, the radiation sources in each of the radiation generators 110, 114 may be arranged in a row or a column. Alternatively, the radiation sources may be arranged in a two-dimensional array or a three-dimensional array. In addition, the radiation beams provided by different radiation sources may have different wavelengths and different powers. Further, the radiation beams provided by adjacent radiation sources may be partially overlapped. In an embodiment, at least one of the radiation generators 110, 114 is a static radiation generator. In a static radiation generator, none of the radiation sources can be rotatable at their respective locations. Accordingly, directions of the radiation beams provided by the radiation sources are fixed during the operation of the vehicle headlights 100. In an embodiment, at least one of the radiation generators 110, 114 is a dynamic radiation generators. In a dynamic radiation generator, at least one of the radiation sources can be rotatable at its respective location so that the radiation beams provided by the at least one of the radiation sources can be redirected to different directions at different times.

In an embodiment, each of the radiation generators 110 and 114 is mounted to a circuit board. For example, the first radiation generator 110 is mounted in or on a first circuit board, as the second radiation generator 114 is mounted in or on a second circuit board. The circuit boards may be electrically connected to a power source through electrically conductive wires by soldering them to different circuit boards or different electrically isolated parts of a single circuit boards. The power source, for example, may be a voltage source, a current source, or a combination thereof. In an embodiment, the voltage source may be configured to supply a constant voltage of 12 volts (V) or 24 V. In an embodiment, the current source may be configured to supply a constant current of 2 amperes (A) or 2.5 A. In an embodiment, the power source may be an external power source. In an embodiment, the power source may be placed inside the heat sink 130.

In an embodiment, the one or more circuit boards may be mounted on the heat conducting member. The heat conducting member may be made of one or more heat conducting materials. In an embodiment, the heat conducting member is made of copper. In an embodiment, at least one of the one or more circuit boards is made of copper. In an embodiment, the one or more circuit boards may be mounted on different sides of the heat conducting member. In an embodiment, the heat conducting member includes a bar and a cylinder coupled to the bar, the bar made of a first heat conducting material, and a cylinder made of a second heat conducting material. In an embodiment, the first heat conducting material is the same as the second heat conducting material. For example, the first heat conducting material and the second heat conducting material are both copper. In an embodiment, the first heat conducting material is different than the second heat conducting material. More details about the heat conducting member and the one or more circuit boards will be discussed in FIG. 9.

In an embodiment, the one or more circuit boards and the heat conducting member are mounted, confined and fastened inside the housing 102 by pressures from the housing 102. In an embodiment, the one or more circuit boards may be fixed to the heat conducting member by the use of a heat conducting electrically insulating adhesive. The one or more circuit boards are in good thermal connection with the heat conducting member such that heat energy generated by the one or more radiation generators 110, 114 can be readily transferred from the one or more circuit boards to the heat conducting member. In an embodiment, at least a portion of the heat conducting member is inside the heat sink 130. The circuit boards may be configured to control the radiation generators 110, 114, as a non-limiting example, turning on or off the radiation generators 110, 114, according to the voltage input and/or current input from the power source.

The connecting body 125 is coupled to the tower body 115. As shown in FIGS. 1-6, the connecting body 125 has a curved surface with a cross-section of the curved surface increased gradually and finally stayed constant from the tower body 115 to the heat sink 130.

The heat sink 130 includes a plurality of heat conducting fins 135 on the side surface of the heat sink. There is an aperture between each adjacent heat conducting fins 135. As seen in FIG. 2 and FIG. 5, the side surface of the heat sink 130 includes a groove 160 having a connection port 155 in the groove 160. The connection port 155 may be configured to be coupled to an electrically conducting cable connected to the power source as discussed above. In an embodiment, the connection port 155 is connected with the plurality of electrically conductive wires, which may be soldered to different circuit boards or different electrically isolated parts of a single circuit boards.

As shown in FIG. 1 and FIG. 6, the heat sink 130 includes a recess on a side surface of the heat sink 130, which provides sufficient space for the fan to be mounted in the recess on the side surface of the heat sink 130. The heat sink 130 is thermally connected to the heat conducting member.

As such, the heat conducting member can transfer the heats generated by the radiation generators 110, 114 to the heat sink 130. The heats can subsequently dissipate with use of the fan 140 through the plurality of apertures between the heat conducting fins 135 in the side surface of the heat sink 130 when the vehicle headlight 100 is in use. As shown in FIGS. 1-8, the side surface of the heat sink 130 includes the surfaces of the heat sink 130 in the X-Y plane (e.g., in FIGS. 3-4) and in the Y-Z plane (e.g., in FIGS. 5-6). The side surface of the heat sink 130 does not include the surface of the heat sink 130 in the X-Z plane (e.g., in FIG. 8), which is sometimes referred to as the bottom surface of the heat sink 130.

The mounting structure 120 is mounted on the housing 102, specifically, the heat sink 130, with the first ring 145 in between as shown in FIGS. 1-6. The first ring 145 is configured to prevent water from being leaked into between the mounting structure 120 and the housing 102 (specifically, the heat sink 130). The first ring 145 is further configured to facilitate the mounting structure 120 fastened on the housing 102 (specifically, on the heat sink 130). In an embodiment, the first ring 145 is a rubber ring. The mounting structure 120 may be configured to aid in installation of the vehicle headlight 100 to a vehicle or an automobile. The mounting structure 120 may be further configured to adjust beam angles of radiations provided by the one or more radiation generators 110, 114 by rotating the vehicle headlight 100. In an embodiment, the mounting structure 120 includes one or more wings 122 configured to aid in twisting the vehicle headlight 100 during installation of the vehicle headlight 100. As shown in FIGS. 1-8, the mounting structure 120 includes three wings. However, a ordinarily skilled person in the art would appreciate that any suitable integer number of wings 122 may be included in the mounting structure 120.

In an embodiment, the second ring 112 is mounted on the mounting structure 120 as shown in FIGS. 1 and 3-7. In an embodiment, the second ring 112 may be mounted on top of the mounting structure 120. The second ring 112 may be configured to facilitate the mounting structure 120 fastened on the vehicle or the automobile during installation of the vehicle headlight 100 to the vehicle or the automobile. The second ring 112 may be further configured to prevent water from being leaked into between the mounting structure 120 and the socket (or the light fixture) of the vehicle or the automobile.

In an embodiment, the vehicle headlight 100 may further include one or more screws, for example the screws 105, 132, 134 as shown in FIGS. 1 and 3 configured to fasten the housing 102 and the various components inside the housing 102.

In an embodiment, the vehicle headlight 100 has a height 180 between 76 millimeters (mm) and 80 mm, a length 190 between 23 mm and 30 mm, and a width 195 between 23 mm and 30 mm as shown in FIGS. 1-6. However, the vehicle headlight 100 may have any other suitable dimensions.

Figure 9:
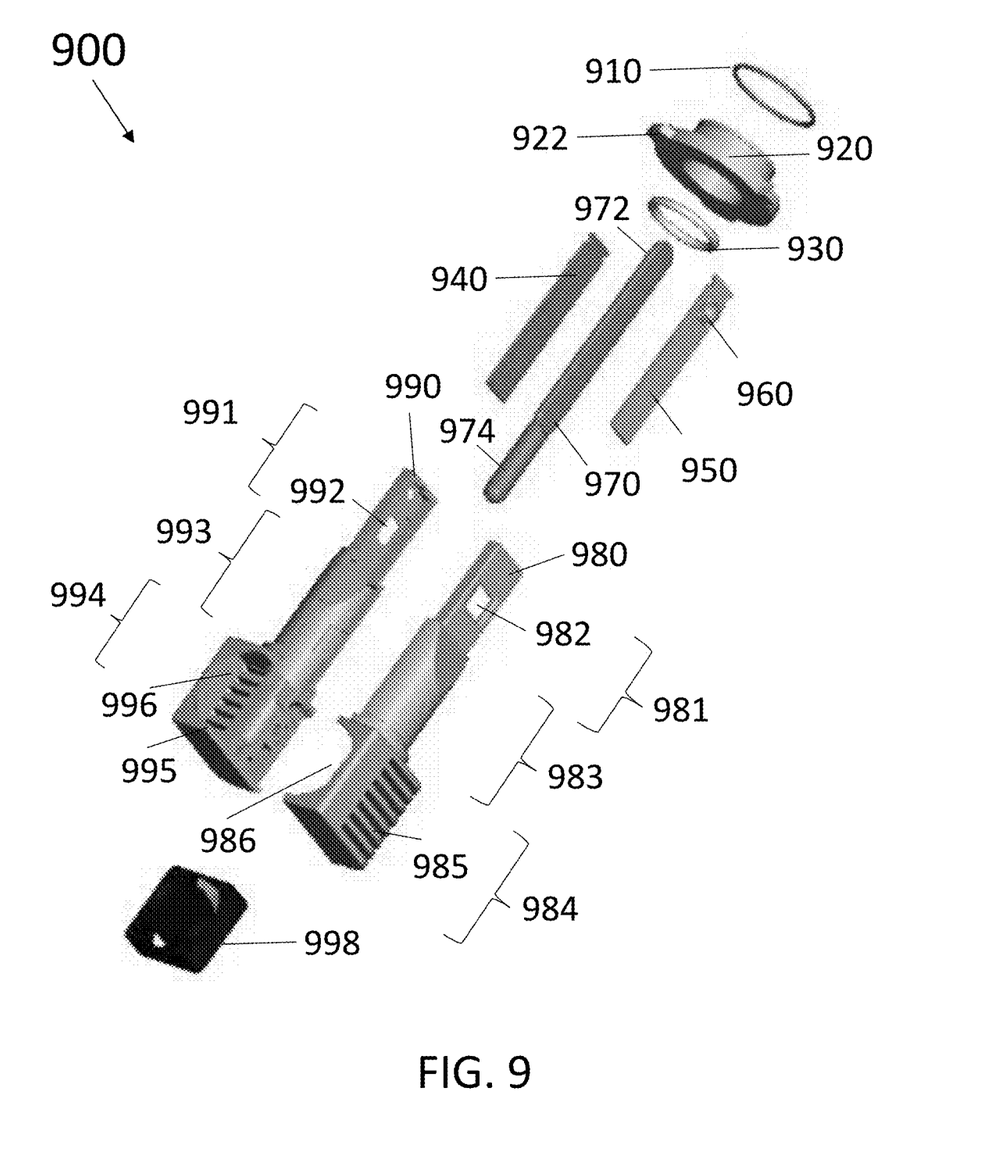
FIG. 9 shows a plurality of components to be used to manufacture a vehicle headlight according to an embodiment of the disclosure.

The manufacturing process of the vehicle headlight, for example, the vehicle headlight 100 depends at least in part on the components to be used to make the vehicle headlight 100. FIG. 9 shows a plurality of components 900 to be used to make the vehicle headlight 100 according to an embodiment of the disclosure.

As shown in FIG. 9, the plurality of components 900 includes a first ring 930, a second ring 910, a mounting structure 920 having one or more wings 922, a first circuit board 950 having a radiation generator 960 mounted on the first circuit board 950, a second circuit board 940, a heat conducting member 970 having a bar 972 and a cylinder 974 coupled to the bar 972, a first housing part 980, a second housing part 990, and a fan 998. Although not shown, the plurality of components 900 may further include one or more screws, which are, or are substantially similar to the screws 105, 132, 134 as shown in FIGS. 1 and 3. Specifically, the first ring 930, the second ring 910, the mounting structure 920, the radiation generator 960, and the fan 998 are, or are substantially similar to, the first ring 145, the second ring 112, the mounting structure 120 having one or more wings 122, the radiation generators 110, 114, and the fan 140 as shown in FIGS. 1-8. The first circuit board 950, the second circuit board 940, and the heat conducting member 970 are, or are substantially similar to, the first circuit board, the second circuit board and the heat conducting member as discussed with respect to FIGS. 1-8. Although not shown, the second circuit board 940 may also have a radiation generator, for example the radiation generator 110 or 114, in or on the second circuit board 940.

Further as shown in FIG. 9, the first housing part 980 includes a first tower body part 981, a first connecting body part 983, and a first heat sink part 984. As can be seen, the first tower body part 981 includes a first opening 982 which is, or is substantially similar to, the openings 103 or 104. The first heat sink part 984 includes a plurality of heat conducting fins 985 each of which is, or is substantially similar to, the heat conducting fins 135 as shown in FIGS. 1-6. The first heat sink 984 also includes a first recessed area 986 on the side surface of the first heat sink 984.

The second housing part 990 includes a second tower body part 991, a second connecting body part 993, and a second heat sink part 994. As can be seen, the second tower body part 991 includes a second opening 992 which is, or is substantially similar to, the openings 103 or 104. The second heat sink part 994 includes a plurality of heat conducting fins 995 each of which is, or is substantially similar to, the heat conducting fins 135 as shown in FIGS. 1-6. The second heat sink 994 also includes a second recessed area 996 on the side surface of the second heat sink 994.

The first housing part 980 and the second housing part 990 may be snapped together to form a housing which is, or substantially similar to, the housing 102 as shown in FIGS. 1-8. The housing formed by snapping together the first housing part 980 and the second housing part 990 may include a recess on the side surface of the housing. The recess, which is the combination of the first recess area 986 and the second recess area 996, may be, or may be substantially similar to, the recess as discussed with respect to FIGS. 1-8, which provides sufficient space to accommodate the fan 998 inside the recess. Specifically, the first tower body part 981 and the second tower body part 991 may be combined (for example, by snapping the first housing part 980 and the second housing part 990 together) to form a tower body which is, or is substantially similar to the tower body 115 as shown in FIGS. 1-6. The first connecting body part 983 and the second connecting body part 993 may be combined (for example, by snapping the first housing part 980 and the second housing part 990 together) to form a connecting body which is, or is substantially similar to the connecting body 125 as shown in FIGS. 1-6. The first heat sink part 984 and the second heat sink part 994 may be combined (for example, by snapping the first housing part 980 and the second housing part 990 together) to form a heat sink, which is, or is substantially similar to the heat sink 130 in FIGS. 1-6 and 8.

As shown in FIG. 9, two housing parts 980, 990 are provided. However, other suitable number of housing parts with same or different configurations may be provided as long as a housing, for example, the housing 102 can be formed by combining these housing parts.

Figure 10:
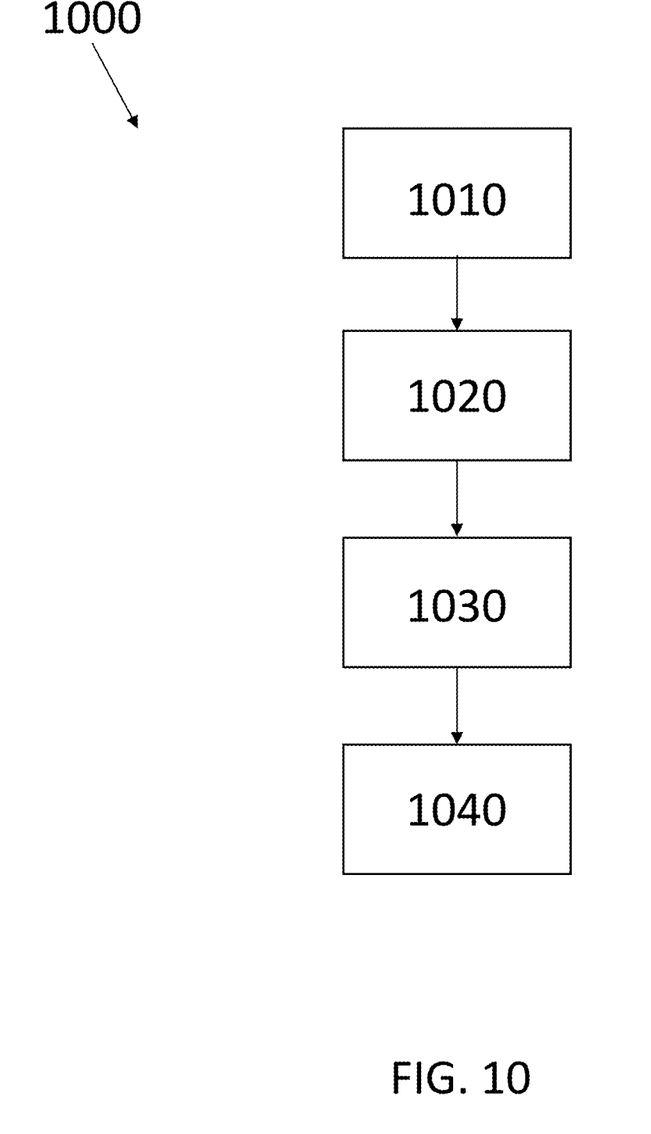
FIG. 10 is a flowchart of an exemplary process for manufacturing a vehicle headlight according to an embodiment of the disclosure.

Referring to FIG. 10, a flowchart 1000 of an exemplary process for manufacturing the vehicle headlight using a plurality of components is shown according to an embodiment of the disclosure. In an embodiment, the vehicle headlight is the vehicle headlight 100. In an embodiment, a height of the vehicle headlight is between 76 mm and 80 mm, a length of the vehicle headlight is between 23 mm and 30 mm, and a width of the vehicle headlight is between 23 mm and 30 mm. In an embodiment, the plurality of components are the plurality of components 900 in FIG. 9.

At step 1010, a heat conducting member and one or more circuit boards are provided, between two housing parts of the vehicle headlight. In an embodiment, one or more radiation generators are attached in or on the one or more circuit boards. In an embodiment, the one or more circuit boards are the first circuit board 950 and the second circuit board 940 as shown in FIG. 9. In an embodiment, the one or more circuit boards include a single circuit board. In an embodiment, the one or more circuit boards include more than two circuit boards. In an embodiment, the two housing parts of the vehicle headlight includes the first housing part 980 and the second housing part 990 as shown in FIG. 9. In an embodiment, the one or more radiation generators includes, but are not limited to, one or more LEDs. In an embodiment, the heat conducting member includes a bar and a cylinder coupled to the bar. In an embodiment, the bar is made of a first heat conducting material, and the cylinder is made of a second heat conducting material. In an embodiment, the heat conducting member having the bar and the cylinder coupled to the bar is the heat conducting member 970 having the bar 972 and the cylinder 974 coupled to the bar 972. In an embodiment, the first heat conducting material is different than the second heat conducting material. In an embodiment, the first heat conducting material is the same as the second heat conducting material. In an embodiment, the first heat conducting material and the second heat conducting material are both copper. In an embodiment, the one or more circuit boards may be mounted on different sides of the bar of the heat conducting member before step 1010 is performed.

At step 1020, a housing of the vehicle headlight is formed by snapping the two housing parts together. In an embodiment, the heating conducting member and the one or more circuit boards are attached and fastened inside the housing. In an embodiment, the one or more circuit boards are mounted to different sides of the bar of the heating conducting member. In an embodiment, the housing includes an recess on a side surface of the housing. In an embodiment, the recess on the side surface of the housing is the combination of the first recess area 986 and the second recess area 996 in FIG. 9. In an embodiment, the side surface of the housing includes a groove having a connection port in the groove, the connection port being configured to be coupled to an electrical cable connected to a power source. In an embodiment, the groove is the groove 160 in FIGS. 2 and 5. In an embodiment, the connection port is the connection port 155 in FIGS. 2 and 5. In an embodiment, the housing includes one or more openings configured to uncover the one or more radiation generators in the housing of the vehicle headlight. In an embodiment, the one or more openings are the one or more openings 103, 104 in FIG. 1-4 or 982, 992 in FIG. 9.

In an embodiment, a fan is in the recess of the side surface of the housing. In an embodiment, the fan is mounted in, for example, by soldering to, the recess of the side surface of the housing after the housing is formed by snapping the two housing parts together. In an embodiment, at least a portion of the fan is mounting in, for example, by soldering to, the recess area of one of the housing parts before the housing is formed by snapping the two housing parts together. In an embodiment, the two housing parts are the first housing part 980 and the second housing part 990. In an embodiment, the recess area of one of the housing parts is the recess area 986 of the first housing part 980 or the recess area 996 of the second housing part 990. In an embodiment, the fan is the fan 140 or 998. In an embodiment, the side surface of the housing comprises one or more apertures configured to facilitate, through use of the fan, dissipation of heats generated by the one or more radiation generators and transferred to the cylinder of the heat conducting member when the vehicle headlight is in use. In an embodiment, the housing is made of one or more materials selected from a group consisting of aluminum and zincum.

At step 1030, a mounting structure is mounted to the housing with a first ring in between. In an embodiment, the mounting structure is the mounting structure 120 or 920. In an embodiment, the first ring is the first ring 145 or 930. In an embodiment, the first ring is a rubber ring. In an embodiment, a second ring is mounted on top of the mounting structure. In an embodiment, the second ring is the second ring 112 or 910. The mounting structure may be configured to aid in installation of the vehicle headlight to a vehicle. The mounting structure may be further configured to adjust beam angles of radiations provided by the one or more radiation generators by rotating the vehicle headlight. In an embodiment, the mounting structure includes one or more wings configured to aid in twisting the vehicle headlight during installation of the vehicle headlight. In an embodiment, the one or more wings are the one or more wings 122 or 922.

At step 1040, the housing of the vehicle headlight is fastened by twisting one or more screws into the housing. In an embodiment, the one or more screws are the screws 105, 132, and 134 in FIGS. 1 and 3.

In an embodiment, there is provided a method of manufacturing a vehicle headlight, the method comprising: providing, between two housing parts of the vehicle headlight, a heat conducting member and one or more circuit boards, wherein one or more radiation generators are attached in or on the one or more circuit boards; forming a housing of the vehicle headlight by snapping the two housing parts together, wherein the heating conducting member and the one or more circuit boards are attached and fastened inside the housing, wherein the housing comprises an recess on a side surface of the housing, and wherein a fan is in the recess on the side surface of the housing.

In an embodiment, the side surface of the housing comprises a groove having a connection port in the groove, and wherein the connection port is configured to be coupled to an electrical cable connected to a power source.

In an embodiment, the heat conducting member comprises a bar and a cylinder coupled to the bar, and wherein the bar is made of a first heat conducting material, and the cylinder is made of a second heat conducting material.

In an embodiment, the method further comprises mounting a mounting structure to the housing with a rubber ring in between, wherein the mounting structure is configured to aid in installation of the vehicle headlight to a vehicle, wherein the mounting structure is further configured to adjust beam angles of radiations provided by the one or more radiation generators by rotating the vehicle headlight, and wherein the mounting structure comprises one or more wings configured to aid in twisting the vehicle headlight during installation of the vehicle headlight.

In an embodiment, the housing comprises one or more openings configured to uncover the one or more radiation generators in the housing of the vehicle headlight.

In an embodiment, the side surface of the housing comprises one or more apertures configured to facilitate, through use of the fan, dissipation of heats generated by the one or more radiation generators and transferred to the cylinder of the heat conducting member when the vehicle headlight is in use.

In an embodiment, the first heat conducting material and the second heat conducting material are copper, and the housing is made of one or more materials selected from a group consisting of aluminum and zincum.

In an embodiment, the one or more radiation generators are LEDs.

In an embodiment, a height of the vehicle headlight is between 76 mm and 80 mm, a length of the vehicle headlight is between 23 mm and 30 mm, and a width of the vehicle headlight is between 23 mm and 30 mm.

In an embodiment, the method further comprises mounting the one or more circuit boards on different sides of the bar of the heat conducting member.

In an embodiment, there is provided a vehicle headlight comprising: one or more circuit boards, wherein one or more radiation generators are attached in or on the one or more circuit boards; a heat conducting member, wherein the one or more circuit boards are mounted to the heat conducting member; a heat sink thermally coupled to the heat conducting member, wherein the heat sink comprises an recess on a side surface of the heat sink; and a fan mounted in the recess on the side surface of the heat sink.

In an embodiment, the side surface of the heat sink comprises a groove having a connection port in the groove, and wherein the connection port is configured to be coupled to an electrical cable connected to a power source.

In an embodiment, the heat conducting member comprises a bar and a cylinder coupled to the bar, and wherein the bar is made of a first heat conducting material, and the cylinder is made of a second heat conducting material.

In an embodiment, the vehicle headlight further comprises a mounting structure mounted on the heat sink with a rubber ring in between, wherein the mounting structure is configured to aid in installation of the vehicle headlight to a vehicle, and wherein the mounting structure is further configured to adjust beam angels of radiations provided by the one or more radiation generators by rotating the vehicle headlight.

In an embodiment, the mounting structure comprises one or more wings configured to aid in twisting the vehicle headlight during installation of the vehicle headlight.

In an embodiment, the side surface of the heat sink comprises one or more apertures configured to facilitate, through use of the fan, dissipation of heats generated by the one or more radiation generators and transferred to the cylinder of the heat conducting member when the vehicle headlight is in use.

In an embodiment, the first heat conducting material and the second heat conducting material are copper, and the housing is made of one or more materials selected from a group consisting of aluminum and zincum.

In an embodiment, the one or more radiation generators are LEDs.

In an embodiment, a height of the vehicle headlight is between 76 mm and 80 mm, a length of the vehicle headlight is between 23 mm and 30 mm, and a width of the vehicle headlight is between 23 mm and 30 mm.

In an embodiment, the one or more circuit boards are mounted to different sides of the bar of the heat conducting member.

Those skilled in the art will recognize that the present disclosure is amenable to a variety of modifications and/or enhancements. While the foregoing description and drawings represent embodiments of the present disclosure, it will be understood that various additions, modifications, and substitutions may be made therein without departing from the spirit and scope of the principles of the present disclosure as defined in the accompanying claims. One skilled in the art will appreciate that the present disclosure may be used with many modifications of form, structure, arrangement, proportions, materials, elements, and components and otherwise, used in the practice of the disclosure, which are particularly adapted to specific environments and operative requirements without departing from the principles of the present disclosure. The presently disclosed embodiments are therefore to be considered in all respects as illustrative and not restrictive, the scope of the present disclosure being indicated by the appended claims and their legal equivalents, and not limited to the foregoing description.

What is claimed is:

1. A method of manufacturing a vehicle headlight, the method comprising:

providing, between two housing parts of the vehicle headlight, a heat conducting member and one or more circuit boards, wherein one or more radiation generators are attached in or on the one or more circuit boards, wherein a first housing part of the two housing parts comprises a first tower body having a first opening, a first connecting body, and a first heat sink part having a first recessed area, and wherein a second housing part of the two housing parts comprises a second tower body having a second opening, a second connecting body, and a second heat sink part having a second recessed area;

soldering at least a portion of a fan to one of the first recessed area of the first housing part and the second recessed area of the second housing part before a housing is formed, forming the housing of the vehicle headlight by snapping the two housing parts together, wherein the heating conducting member and the one or more circuit boards are attached and fastened inside the housing, wherein the housing comprises a recess on a lateral surface of the housing, wherein the fan is in the recess on the lateral surface of the housing, and wherein the heat conducting member extends perpendicular to an opening of the fan; and soldering the fan in the recess on the lateral surface of the housing after the housing is formed, wherein the housing further comprises a tower body having the first opening and the second opening, a connecting body, and a heat sink having the recess, and wherein the first tower body of the first housing part and the second tower body of the second housing part collectively make the tower body of the housing, the second connecting body of the first housing part and the second connecting body of the second housing part collectively make the connecting body of the housing, the first heat sink part of the first housing part and the second heat sink part of the second housing part collectively make the heat sink of the housing, and the first recessed area and the second recessed area collectively make the recess.

2. The method of claim 1, wherein the lateral surface of the housing comprises a groove having a connection port in the groove, and wherein the connection port is configured to be coupled to an electrical cable connected to a power source.

3. The method of claim 2, wherein the heat conducting member comprises a bar and a cylinder coupled to the bar, and wherein the bar is made of a first heat conducting material, and the cylinder is made of a second heat conducting material.

4. The method of claim 3, further comprising mounting a mounting structure to the housing with a rubber ring in between, wherein the mounting structure is configured to aid in installation of the vehicle headlight to a vehicle, wherein the mounting structure is further configured to adjust beam angles of radiations provided by the one or more radiation generators by rotating the vehicle headlight, and wherein the mounting structure comprises one or more wings configured to aid in twisting the vehicle headlight during installation of the vehicle headlight.

5. The method of claim 4, wherein the first opening and the second opening are configured to uncover the one or more radiation generators in the housing of the vehicle headlight.

6. The method of claim 5, wherein the lateral surface of the housing comprises one or more apertures configured to facilitate, through use of the fan, dissipation of heats generated by the one or more radiation generators and transferred to the cylinder of the heat conducting member when the vehicle headlight is in use.

7. The method of claim 6, wherein the first heat conducting material and the second heat conducting material are copper.

8. The method of claim 7, wherein the one or more radiation generators are Light-Emitting Diodes (LEDs).

9. The method of claim 8, wherein a height of the vehicle headlight is between 76 millimeter (mm) and 80 mm, a length of the vehicle headlight is between 23 mm and 30 mm, and a width of the vehicle headlight is between 23 mm and 30 mm.

10. The method of claim 9, further comprising mounting the one or more circuit boards on different sides of the bar of the heat conducting member.

11. A method of manufacturing a vehicle headlight, the method comprising:
providing, between two housing parts of the vehicle headlight, a heat conducting member, a first circuit board, and a second circuit board, wherein the first circuit board and the second circuit board are on different sides of the heat conducting member, wherein one or more radiation generators are attached in or on the first circuit board and the second circuit board, wherein a first housing part of the two housing parts comprises a first tower body having a first opening, a first connecting body, and a first heat sink part having a first recessed area, and wherein a second housing part of the two housing parts comprises a second tower body having a second opening, a second connecting body, and a second heat sink part having a second recessed area;
soldering at least a portion of a fan to one of the first recessed area of the first housing part and the second recessed area of the second housing part before a housing is formed;
forming the housing of the vehicle headlight by snapping the two housing parts together, wherein the heating conducting member, the first circuit board, and the second circuit board are attached inside the housing, wherein the housing comprises a recess on a lateral surface of the housing, wherein the fan is in the recess on the lateral surface of the housing, and wherein the heat conducting member extends perpendicular to an opening of the fan; and
soldering the fan in the recess on the lateral surface of the housing after the housing is formed,
wherein the housing further comprises a tower body having the first opening and the second opening, a connecting body, and a heat sink having the recess, and wherein the first tower body of the first housing part and the second tower body of the second housing part collectively make the tower body of the housing, the second connecting body of the first housing part and the second connecting body of the second housing part collectively make the connecting body of the housing, the first heat sink part of the first housing part and the second heat sink part of the second housing part collectively make the heat sink of the housing, and the first recessed area and the second recessed area collectively make the recess.

12. The method of claim 11, wherein the heat conducting member comprises a bar and a cylinder coupled to the bar, and wherein the bar is made of a first heat conducting material, and the cylinder is made of a second heat conducting material.

13. The method of claim 12, further comprising mounting a mounting structure to the housing with a rubber ring in between, wherein the mounting structure is configured to aid in installation of the vehicle headlight to a vehicle, wherein the mounting structure is further configured to adjust beam angles of radiations provided by the one or more radiation generators by rotating the vehicle headlight, and wherein the mounting structure comprises one or more wings configured to aid in twisting the vehicle headlight during installation of the vehicle headlight.

14. The method of claim 13, wherein the first opening and the second opening are configured to uncover the one or more radiation generators in the housing of the vehicle headlight.

15. The method of claim 14, wherein the lateral surface of the housing comprises one or more apertures configured to facilitate, through use of the fan, dissipation of heats generated by the one or more radiation generators and transferred to the cylinder of the heat conducting member when the vehicle headlight is in use.

16. The method of claim 15, wherein the one or more radiation generators are Light-Emitting Diodes (LEDs).

* * * * *